United States Patent [19]

Thillays

[11] Patent Number: 4,727,457
[45] Date of Patent: Feb. 23, 1988

[54] SURFACE-MOUNTED OPTOELECTRONIC DEVICE

[75] Inventor: Jacques C. Thillays, Herouville, France

[73] Assignee: U.S. Philips Corporation, New York, N.Y.

[21] Appl. No.: 910,105

[22] Filed: Sep. 22, 1986

[30] Foreign Application Priority Data

Jan. 24, 1986 [FR] France .................................. 86 01028

[51] Int. Cl.⁴ .............................................. F21V 7/04
[52] U.S. Cl. ........................................ 362/32; 362/26; 362/29; 362/800
[58] Field of Search ....................... 362/800, 26, 29, 32

[56] References Cited

U.S. PATENT DOCUMENTS

| 4,206,493 | 6/1980 | Towne et al. | 362/800 X |
| 4,521,835 | 6/1985 | Meggs et al. | 362/800 X |
| 4,544,252 | 10/1985 | Tsukamoto | 362/29 X |
| 4,555,749 | 11/1985 | Rifkin et al. | 362/800 X |

Primary Examiner—Larry Jones
Attorney, Agent, or Firm—Robert T. Mayer; Steven R. Biren

[57] ABSTRACT

The invention relates to an optoelectronic device for surface mounting of the type comprising an insulating substrate, whose upper surface receives at least one optoelectronic element electrically connected to contacts of the lower surface of the substrate through conductive strips. An annular spacer is fixed to the upper surface of the substrate. A spherical lens is glued on the annular spacer and the plane of light emission is situated at a distance from the spherical lens which is smaller than its extension.

7 Claims, 4 Drawing Figures

SURFACE-MOUNTED OPTOELECTRONIC DEVICE

BACKGROUND OF THE INVENTION

The invention relates to an optoelectronic device for surface mounting comprising an insulating substrate having an upper surface, on which is disposed at least one optoelectronic element, and conductive strips disposed on the upper surface and electrically connected to contact members situated on the lower surface of the substrate, a first conductive strip being in electrical contact with the lower surface of the optoelectronic element and at least a second conductive strip being connected through a conductive wire to the upper surface of the optoelectronic element.

Such a device is known from European Pat. No. 83627. In this patent, the optoelectronic element is molded in a dome of epoxy resin, which ensures its tightness. This moulding technique does not permit obtaining a very high optical quality, especially because of problems of centering, of shrinkage and of the state of the surface.

A know technique for combining an optical system with an optoelectronic element consists of providing a lens from molten glass in a window of the device, which also ensures the tightness of the optoelectronic element. The result is better than before, but the form obtained does not lie exactly in the optical plane because it corresponds to the form of a drop and the surface state is not of very high quality.

Another technique described in Patent Application PCT No. 82/04500 provides a spherical microlens which is located in a ring formed on the optoelectronic element, and the assembly is enveloped in a transparent polymer, thus ensuring the tightness of the optoelectronic element. Such an envelope adversely affects the optical performance of the device for reasons already mentioned and it moreover makes it impossible for the device to be surface-mounted.

SUMMARY OF THE INVENTION

The invention has for its object to provide a tight optoelectronic device for surface mounting which also has a high optical quality and which can be readily manufactured because it comprises a minimum number of parts to be assembled.

The device according to the invention is for this purpose characterized in that it comprises an annular spacer enclosing the optoelectronic element and fixed in a tight manner to the upper surface of the insulating substrate so that its axis is exactly the optical axis of the optoelectronic element, the spacer having a height exceeding the thickness of the optoelectronic element, and in that it comprises a spherical lens of a transparent material having a diameter exceeding the inner diameter of the annular spacer and glued in a tight manner against the latter and spaced apart from the upper surface of the optoelectronic element by a distance such that the plane of the light emission of the optoelectronic element is situated at a distance from the spherical lens less than or equal to its extension.

According to an embodiment, the inner space of the annular spacer limited by the insulating substrate, the optoelectronic element and the spherical lens, is filled by a transparent glue having a given index of refraction intended to ensure the tight gluing of the spherical lens. This glue has also the effect that it increases the extension of the spherical lens.

According to a preferred embodiment, the device in accordance with the invention is made insensitive to the problems of thermal expansion in that for the insulating substrate, for the annular spacer and for the spherical lens materials are chosen comprising mainly alumina. By way of example, the insulating substrate is made of ceramic material, the annular spacer is made of alumina and the spherical lens is made of sapphire or of ruby.

According to a variation particularly suitable for use in two-color devices, at least two optoelectronic elements are enclosed by the annular spacer and the upper surfaces of the optoelectronic elements are each connected through a conductive wire to the second and to a third conductive strip.

BRIEF DESCRIPTION OF THE DRAWING

In order that the invention may be readily carried out, it will now be described more fully, by way of example, with reference to the accompanying drawing, in which.

DESCRIPTION OF THE PREFERRED EMBODIMENTS

Figure 1:
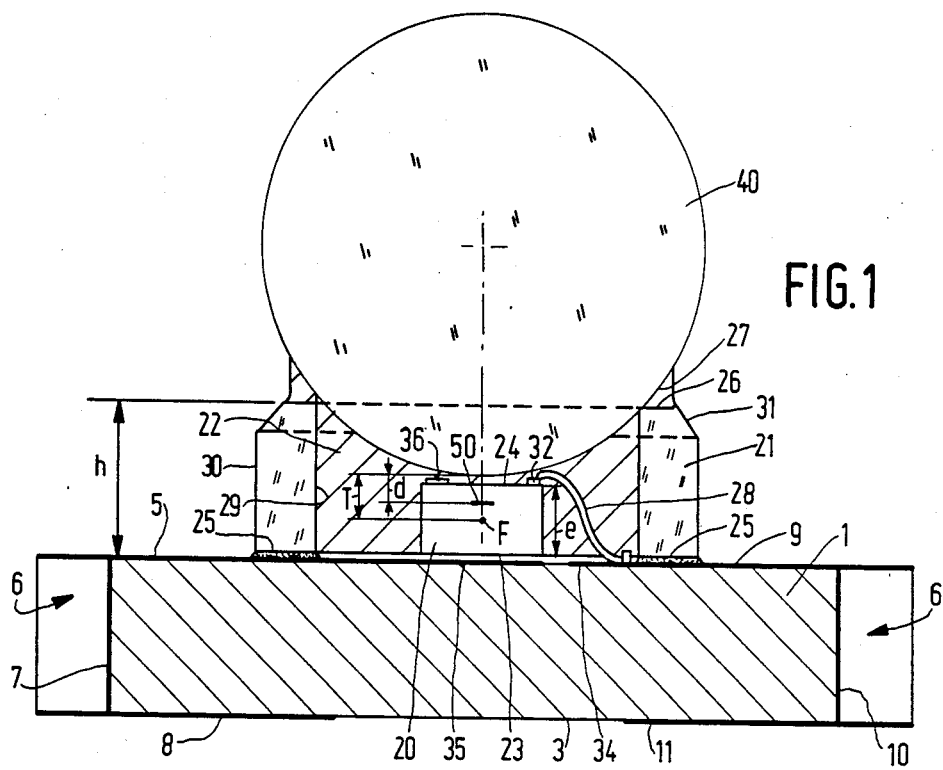
FIG. 1 and FIG. 2 show in vertical sectional view and in plan view, respectively, a device according to the invention.
Figure 2:
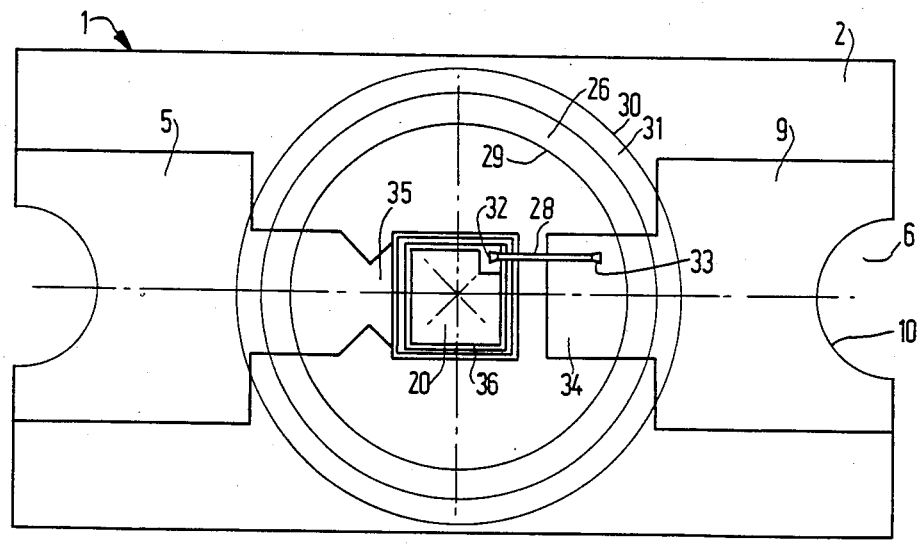

According to FIGS. 1 and 2, the device in accordance with the invention comprises an insulating substrate 1 of, for example, ceramic material, whose upper surface 2 comprises two conductive strips 5 and 9 which are advantageously obtained by silk screen printing and are connected with two conductive strips 8 and 11, respectively, of the lower surface 3 of the substrate. The conductive strips 8 and 11 constitute the contact members of the lower surface 3.

The insulating substrate is provided laterally and on each of its two opposite sides with an opening of semi-circular cross-section. Each opening 6 is entirely covered with a conductive layer 10, which makes electrical contact on the one hand with the conductive strips 5 and 8 and on the other hand with the conductive strips 9 and 11.

In the case in which the insulating substrate 1 is made of ceramic material, the conductive strips 5, 8, 9 and 11 as well as the conductive layer 10 can be readily obtained by silk screen printing by using, for example, the technology utilized for the manufacture of the ceramic supports for semiconductors or ceramic capacitors.

An optoelectronic element 20, for example an electroluminescent element such as a light-emitting diode, is soldered by its lower surface 23 on a leg 35 of the conductive layer 5 in such a manner that one of its electrodes is in electrical contact with the latter. Its other electrode 36 is constituted by an annular metallization 36 on the upper surface 24 of the element 20 having a leg 32 of small dimensions, which permits soldering thereto one end of a wire 28, whose other end is soldered at 33 to a leg 34 of the conductive strip 9.

A spherical lens 40, for example, a ball of a quality used in clockworks, of ruby or of sapphire is disposed against an annular spacer 21, whose inner diameter 29 is for this purpose smaller than the diameter of the ball. The diameter 29 and the height h of the annular spacer 21 are chosen in such a manner that the active luminous plane 50, i.e. the plane of light emission for a light-emitting diode, which is situated within the optoelectronic element 20, is itself disposed at a distance d from the edge of the lens 40 which is smaller than or equal to its extension.

The spherical lens 40 is advantageously fixed by means of a transparent glue 22 having a given index, which fills the inner space of the annular spacer 21 limited by the upper surface 2 of the substrate 1, the element 20 and the spherical lens 40, while slightly projecting at 27 in order to ensure that the lens 40 is fixed. The annular spacer 21 is itself fixed in a tight manner on the substrate 1, for example by means of a soldering paste deposited by silk-screen printing, which permits obtaining a reproducible thickness.

When the distance d is equal to the extension T of the lens 40, the focus of the lens 40 taken along the optical axis of the element 20 is situated in the plane 50 and as close as possible to its center in the case shown, in which a single element 20 is utilized.

In other words: the optical axis of the element 20 passes the center of the spherical lens 40 as closely as possible.

This position corresponds to the maximum directivity of the device.

When the distance d is smaller than the extension T, the device is less directive. Therefore, it is easy to obtain a device having the desired directivity by influencing the height h of the annular spacer 21 or the thickness e of the element 20.

If the index of refraction of the spherical lens 40 is designated by N, its radius is designated by R and the index of the glue 22 is designated by n, the extension T of the lens has the value:

$$T = \frac{n(2-N)}{N - 2n + nN} |R|.$$

It should be born in mind that the extension T is the distance between the focus F taken along the optical axis and the edge of the lens.

By way of example, for a lens 40 of ruby or sapphire (N=1.768) having a diameter of 1500 μm, it is found that T=168 μm with an elastomeric glue having an index n=1.4 and T=194 μm with a photopolymerisable glue having an index n=1.56. If the gluing operation is carried out so that the inner space is left free (n=1), there is obtained: T=109 μm. The presence of the glue 22 in the inner space considerably increases the extension of the lens 40 and thus permits a more accurate positioning.

It should be noted that the use of an elastomeric glue avoids the mechanical limitations, while the use of the photopolymerizable glue introduces only small limitations.

The device according to the invention has all of the features desired for a surface mounted component.

The spherical lens 40 fulfills a double function, on the one hand an optical function, as already stated, and on the other hand a mechanical function because it ensures the closure and tightness of the device. The ruby or the sapphire are perfectly adapted because these are hard materials.

Moreover, if a substrate 1, an annular spacer 21 and a spherical lens 40 are used made of materials mainly comprising alumina, for example, by choosing a substrate 1 of ceramic material, an annular spacer 21 of alumina and a spherical lens 40 of ruby or of sapphire, the device is insensitive to the temperature variations because these materials have thermal expansion coefficients which are substantially identical.

Figure 3:
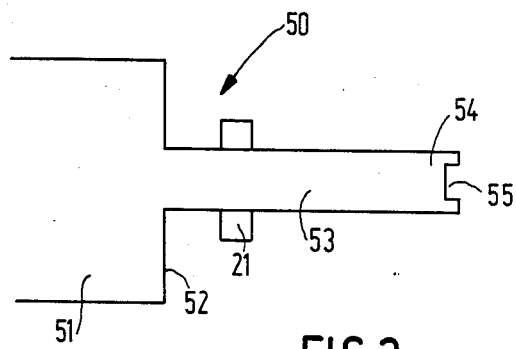
FIG. 3 shows an embodiment of a jig for assembling an optoelectronic device according to the invention.

FIG. 3 shows a jig 50 for concentrically mounting an element 20 and an annular spacer 21. It comprises a cylindrical rear part which is prolonged towards the front side by a shaft 53 of smaller diameter which is equal to a small amount of clearance approximately equal to the inner diameter 29 of the annular spacer 21. The front part 54 of the shaft 53 has a square recess 55 which is accurately centered on the shaft 53 and which accommodates an element 20. It is sufficient to arrange the jig by means of a binocular with respect to markers of the substrate in such a manner that the element 20 and the annular spacer 21 are in turn arranged with a very high concentricity at the area chosen.

Figure 4:
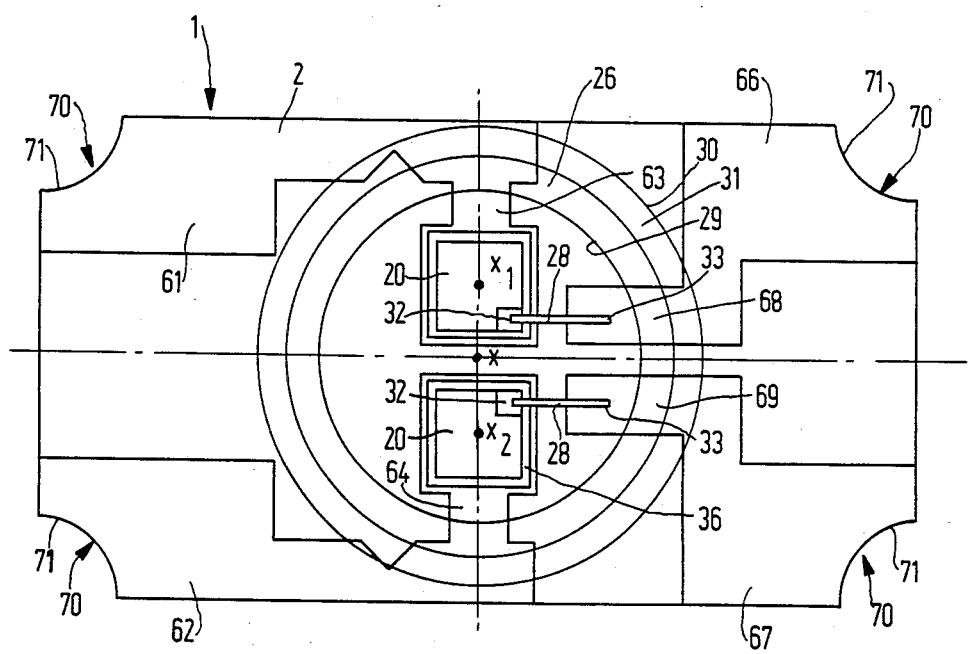
FIG. 4 shows in plan view a variation of the invention comprising two optoelectronic elements.

FIG. 4 illustrates the case in which two optoelectronic elements 20 are used within the annular spacer 21. Such an arrangement is particularly important in the case of two- or three-color indicators. In this case, each of the elements 20 is soldered on a conductive leg 63, 64 of a conductive strip 61, 62. Each of them comprises a conductive wire 28 connecting its upper electrode 36 to a conductive leg 68, 69 of a conductive strip 66, 67 associated with it. The conductive strips 61, 62, 66 and 67 are in electrical contact with contact members disposed at the corners of the lower surface 3 due to four conductive layers 71 covering openings 70 having a cross-section in the form of a quarter of a circle and disposed at the four corners of the insulating substrate 1.

Ecah of the opetoelectronic elements 20 has an optical axis $X_1$, $X_2$. The optical axis of the device is chosen to be the medium of the axes $X_1$ and $X_2$. The elements 20 can be positioned by means of a jig such as 50 having two recesses 55.

What is claimed is:

1. An optoelectronic device for surface mounting comprising an insulating substrate having an upper and a lower surface, at least one optoelectronic element mounted at said upper surface, contact members on said lower surface, conductive strips disposed on the upper surface and in electrical contact with said contact members on the lower surface, a first of said conductive strips being in electrical contact with the lower surface of the optoelectronic element and at least a second of said conductive strips being connected to the upper surface of the optoelectronic element, an annular spacer enclosing but spaced apart from said optoelectronic element and fixed to the upper surface of the insulating substrate so that its axis is aligned with the optical axis of the optoelectronic element, said spacer having a height exceeding the thickness of the optoelectronic element, and a spherical lens of a transparent material having a diameter exceeding the inner diameter of the annular spacer, glued to the latter and spaced apart from the upper surface of the optoelectronic element by a distance such that the plane of light emission of the optoelectronic element is situated at a distance d from the spherical lens which is smaller than or equal to its extension, which is the distance between the focus F and the edge of the lens.

2. A device as claimed in claim 1, characterized in that the inner space of the said annular spacer, limited by the insulating substrate, the optoelectronic element and the spherical lens, is filled by a transparent glue having a given index of refraction and serving to ensure that the spherical lens is tightly glued to the rest of the device.

3. A device as claimed in claim 1 or 2, characterized in that the insulating substrate, the annular spacer and the spherical lens are made of materials mainly comprising alumina.

4. A device as claimed in claim 3, characterized in that the insulating substrate comprises a ceramic material.

5. A device as claimed in claim 3, characterized in that the annular spacer consists of alumina.

6. A device as claimed in claim 3, characterized in that the spherical lens comprises a material selected from the group consisting of sapphire and ruby.

7. A device as claimed in claim 1 or 2, further comprising a third conductive strip and at least two optoelectronic elements enclosed by said annular spacer, the upper surfaces of the optoelectronic elements each being connected to one of said second and said third conductive strips.

* * * * *